(12) United States Patent
Martin et al.

(10) Patent No.: US 7,526,744 B2
(45) Date of Patent: Apr. 28, 2009

(54) INTEGRATED CIRCUIT DESIGN METHOD FOR EFFICIENTLY GENERATING MASK DATA

(75) Inventors: Robert J. Martin, Fort Collins, CO (US); Anthony J. Abeyta, Jr., Fort Collins, CO (US); Peter J. Meier, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 177 days.

(21) Appl. No.: 11/669,202

(22) Filed: Jan. 31, 2007

(65) Prior Publication Data

US 2008/0184188 A1 Jul. 31, 2008

(51) Int. Cl.
*G06F 17/50* (2006.01)
(52) U.S. Cl. ............................ 716/12; 716/13; 716/19
(58) Field of Classification Search ........................ None
See application file for complete search history.

(56) References Cited

U.S. PATENT DOCUMENTS

| | | | | |
|---|---|---|---|---|
| 4,636,965 A * | 1/1987 | Smith et al. | ............... | 716/12 |
| 6,449,758 B1 * | 9/2002 | Satoh et al. | ............... | 716/10 |
| 7,322,019 B2 * | 1/2008 | Sato et al. | ............... | 716/10 |
| 7,398,497 B2 * | 7/2008 | Sato et al. | ............... | 716/10 |

* cited by examiner

*Primary Examiner*—Leigh Marie Garbowski

(57) ABSTRACT

A method for generating mask data includes receiving a set of routing definitions that enable conductor routing schemes having the same cell pitch, identifying locations in response to a characteristic of the set, presenting a representation of a portion of the mask data and applying a select member of the set of routing definitions to locate and size conductors modeled in the mask data. A design tool includes a memory and a processor. The memory stores routing definitions that enable conductor routing schemes having the same cell pitch. The processor receives an input identifying a select routing definition from the set of routing definitions. The processor executes logic that generates an array of points responsive to a characteristic of the routing definitions. The processor further executes logic configured to constrain the relative location and width of conductors in the integrated circuit.

25 Claims, 7 Drawing Sheets

| | A | B | C | D | E | F | G | H | I |
|---|---|---|---|---|---|---|---|---|---|
| BORDER CONDUCTOR WIDTH | 4x | 4x | 4x | 4x | 4x | 4x | 4x | 4x | 4x |
| FIRST SEPARATION | x | 1.5x | 2x | x | 1.5x | 2x | x | 1.5x | 2x |
| CONDUCTOR WIDTH | x | x | x | 1.5x | 1.5x | 1.5x | 2x | 2x | 2x |
| SECOND SEPARATION | 1.5x | 2x | 2x | 1.75x | 1.75x | 2.25x | 1.5x | 2x | 3x |
| NO. OF CONDUCTORS / CELL | 9 | 7 | 6 | 7 | 6 | 5 | 6 | 5 | 4 |

X = UNIT CONDUCTOR WIDTH = MINIMUM SEPARATION BETWEEN ADJACENT CONDUCTORS

*FIG. 3*

INTEGRATED CIRCUIT DESIGN METHOD FOR EFFICIENTLY GENERATING MASK DATA

BACKGROUND

It is common practice to use computer-based design tools when constructing mask data for an integrated circuit. Many of these integrated circuit design tools define a metal-routing template that is used to layout low-level cells throughout the integrated circuit. The routing template defines a minimum conductor width and a minimum space between any two adjacent conductors in the integrated circuit. The routing template is used for completing the design of both standard cells and custom cells. Generally, the routing template is defined such that the resulting integrated circuit will meet a set of design constraints including density, anticipated interconnect routing complexity, timing performance, signal integrity and electro migration.

In custom integrated circuits, such as application-specific integrated circuits (ASICs), it is often the case that the set of constraints to which the routing template is optimized will vary across different sub-circuits within the same ASIC design. This is not only true for a single-layer ASIC but applies sub-circuits on each level of a multiple-level ASIC as well. Accordingly, some integrated circuit design tools permit an operator (e.g., a circuit designer) to modify the routing template for a localized portion of the integrated circuit, while maintaining the same general cell pitch (i.e., the distance between the centerlines of respective electrical ground and power supply conductors that provide power to the cell) from cell to cell over the integrated circuit design.

Often, interconnects (i.e., conductors between sub-circuits) between cells using different routing templates need to be made. A circuit designer tasked with using the design tool to route conductors typically uses a high resolution representation of the circuit to locate end points of the various circuit locations that need to be connected. Once, an end point is located, the designer may or may not change the resolution of the representation to route the conductor that will connect the endpoints. When the display resolution is changed, the designer will often have to choose a different resolution (other than the changed or second resolution) to locate a recognizable circuit feature such as the desired end point. This makes the task of locating the end points and routing these and perhaps other interconnects between the cells of the ASIC a slow and tedious process as the designer continuously modifies the display resolution to complete the task.

Thus, improvements in ASIC design tools are required, specifically in the development of systems and methods that enable improved efficiencies in routing interconnects between cells in the ASIC that use disparate routing templates.

SUMMARY

A variable track routing definition allows multiple routing schemes having approximately the same overall length in a first direction in each region of a metallization layer (i.e., a layer having conductors). Each region is rectangular with conductors that traverse the region arranged substantially orthogonal to the first direction. The variable track routing definition enables integrated circuit designers to select a routing scheme that when implemented enables the resulting integrated circuit to meet timing performance, signal integrity, density, electro migration and perhaps additional constraints, while keeping conductors aligned on a grid. The relative placement of conductors is an important consideration when designing a multiple layered integrated circuit that uses a different routing scheme for placing conductors on adjacent circuit layers. The variable track routing definition reduces interconnection complexity between functional blocks both on the same circuit layer and across two or more layers of the circuit design.

An embodiment describes a method for directing the generation of information defining conductor route constraints in mask data. The method includes the steps of providing a set of routing definitions that define metallization region conductor routing schemes having approximately the same length in a first direction, identifying a characteristic of the set of routing definitions, saving a representation of the set of routing definitions and the characteristic and communicating the representation. The communicated representation is suitable for application in the generation of metallization connections constrained in size and separation in the first direction in the mask data.

An alternative embodiment describes a method for generating mask data for an integrated circuit design. The method includes the steps of receiving a set of routing definitions that define metallization region conductor routing schemes having approximately the same length in a first direction, generating an array of points that each identify a location in mask data responsive to a characteristic of the set of routing definitions, identifying a select member of the set of routing definitions, presenting the array of points in a representation of a portion of the mask data and applying the select member of the set of routing definitions to locate and size conductors modeled in the mask data.

A design tool generates mask data for an integrated circuit. One embodiment of the design tool includes a memory and a processor. The memory is configured to store a set of routing definitions that define sub-region conductor routing schemes having approximately the same length in a first direction. The processor is configured to receive an input identifying a select routing definition from the set of routing definitions. The processor executes logic that generates an array of equally spaced points responsive to a characteristic of the set of routing definitions. The processor further executes logic configured to constrain the width and relative location of conductors in accordance with the select routing definition.

Other devices, methods, features and advantages will be or will become apparent to one skilled in the art upon examination of the following figures and detailed description. All such additional devices, methods, features and advantages are defined and protected by the accompanying claims.

BRIEF DESCRIPTION OF THE DRAWINGS

The present methods for generating mask data and for directing the generation of information defining conductor route constraints in mask data, as well as a design tool that uses the conductor route constraints, as defined in the claims, can be better understood with reference to the following drawings. The components within the drawings are not necessarily to scale relative to each other; emphasis instead is placed upon clearly illustrating underlying principles for making and using the design tool and practicing the methods.

FIG. 3 is a schematic diagram of multiple routing schemes that have the same cell pitch.

DETAILED DESCRIPTION

Figure 1A:
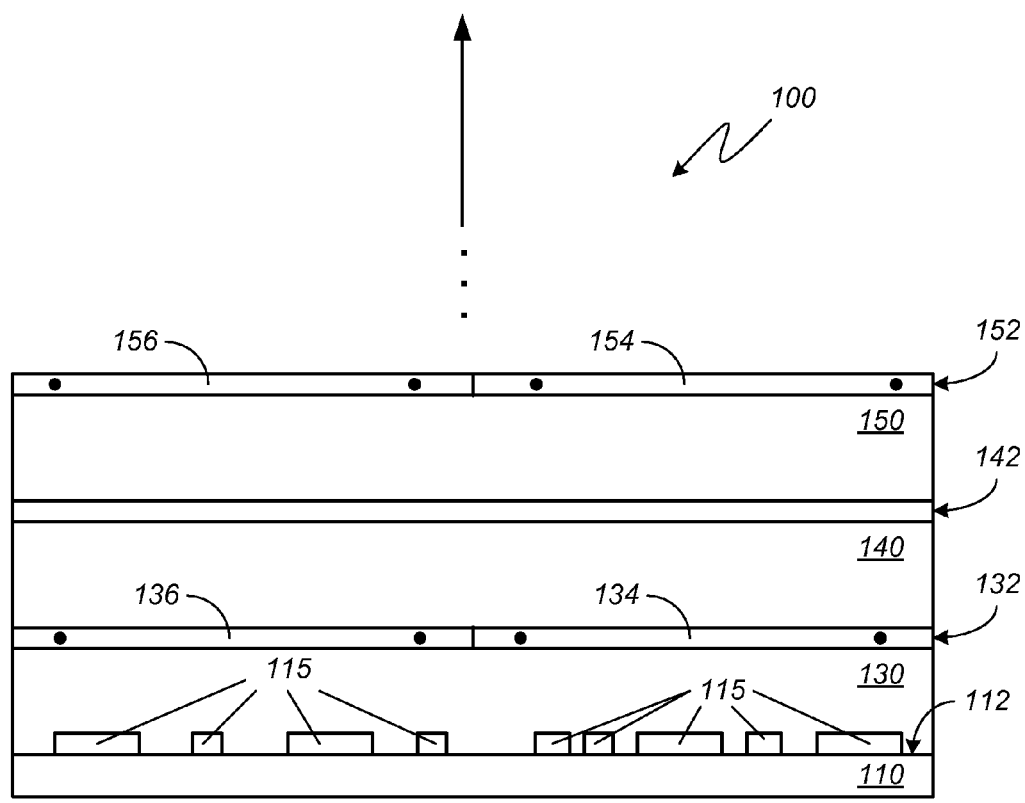
FIGS. 1A and 1B are schematic diagrams illustrating an embodiment of a multiple-layer application-specific integrated circuit.

FIG. 1A is a side view of an example embodiment of a multiple-layer application-specific integrated circuit (ASIC) 100. Multiple-layer ASIC 100 includes a substrate 110, a first metallization layer 132, a second metallization layer 142 and a third metallization layer 152. As indicated by the arrow extending upward above third metallization layer 152, additional metallization layers may be introduced as desired. Both active and passive circuit elements 115 are formed via one or more semiconductor device manufacturing steps upon surface 112 of substrate 110. First insulating layer 130 separates circuit elements 115 from first metallization layer 132. Second insulating layer 140 separates first metallization layer 132 from second metallization layer 142. Third insulating layer 150 separates second metallization layer 142 from third metallization layer 152.

Metallization layers 132, 142, 152 each include conductors that connect various circuit elements 115 to one another as required to realize a desired integrated circuit arrangement. For simplicity of illustration, conductive vias that traverse one or more of the insulating layers and intervening metallization layers to connect one or more elements 115 to a select conductor are omitted.

First metallization layer 132 includes region 134 and region 136. Third metallization layer 152 includes region 154 and region 156. Each of region 134, region 136, region 154 and region 156 have conductors that are generally arranged along a direction orthogonal to the upward pointing arrow. That is, the conductors in region 134, region 136, region 154 and region 156 are arranged into and out from the surface of the page. Similarly arranged regions along second metallization layer 142 are arranged orthogonal to the above-mentioned regions on first metallization layer 132 and third metallization layer 152.

A region of a respective metallization layer is an area having a desired length along a first direction and a variable length along a second direction orthogonal to the first direction. As will be explained in greater detail below, the metallization layers (132, 142, 152, etc.) of the multiple layer integrated circuit 100 are rectangular regions where one dimension is arbitrary and typically much longer than the other dimension. The arbitrary dimension is the preferred direction for the conductor routes on that layer. The arbitrary dimension is typically bounded by block boundaries, where a block is a collection of a number (often very large) of cells. A cell is a collection of elements connected to perform a specified function. Block boundaries are defined by alternating power and ground conductors.

Each of the layers of multiple-layer ASIC 100 is fabricated using a series of process steps. For example, many integrated circuits are fabricated via imaging, deposing, etching, doping, cleaning and planarizing steps. Photolithography is generally used to mark different areas of substrate 110 and perhaps the upward facing surfaces of insulating layers disposed above substrate 110 to be doped or to have polysilicon, insulators, or conductors deposited on them. In a complimentary metal-oxide semiconductor (CMOS) manufacturing process, a transistor is formed by the intersection of substantially orthogonal striped layers. The individual stripes can be a monocrystalline substrate, doped layers, insulator layers or polysilicon layers. In some cases, vias interconnect doped layers with conductors in the form of conducting tracks. Resistive structures, meandering stripes of varying lengths and destination circuits combine to form the loads on the circuit. The ratio of the length of the resistive structure to its width, combined with its sheet resistivity determines the resistance. Capacitive structures, very much like the parallel conducting plates of a traditional capacitor, are formed according to the area of the "plates," with insulating material between the plates. Although limited in size, the capacitance of these integrated capacitors relative to the drive capability of a given circuit are more than adequate.

These and other components of multiple-layer ASIC 100 arranged on substrate 110, first metallization layer 132, second metallization layer 142 and third metallization layer 152, among others can be modeled or otherwise depicted as a number of rectangular regions. In the illustrated embodiments, only three metallization layers are shown for simplicity of illustration. It should be understood that multiple-layer ASICs are not limited to any specific number of metallization layers and that the particular function(s) and the semiconductor manufacturing process will dictate the surface area for each individual cell.

Figure 1B:
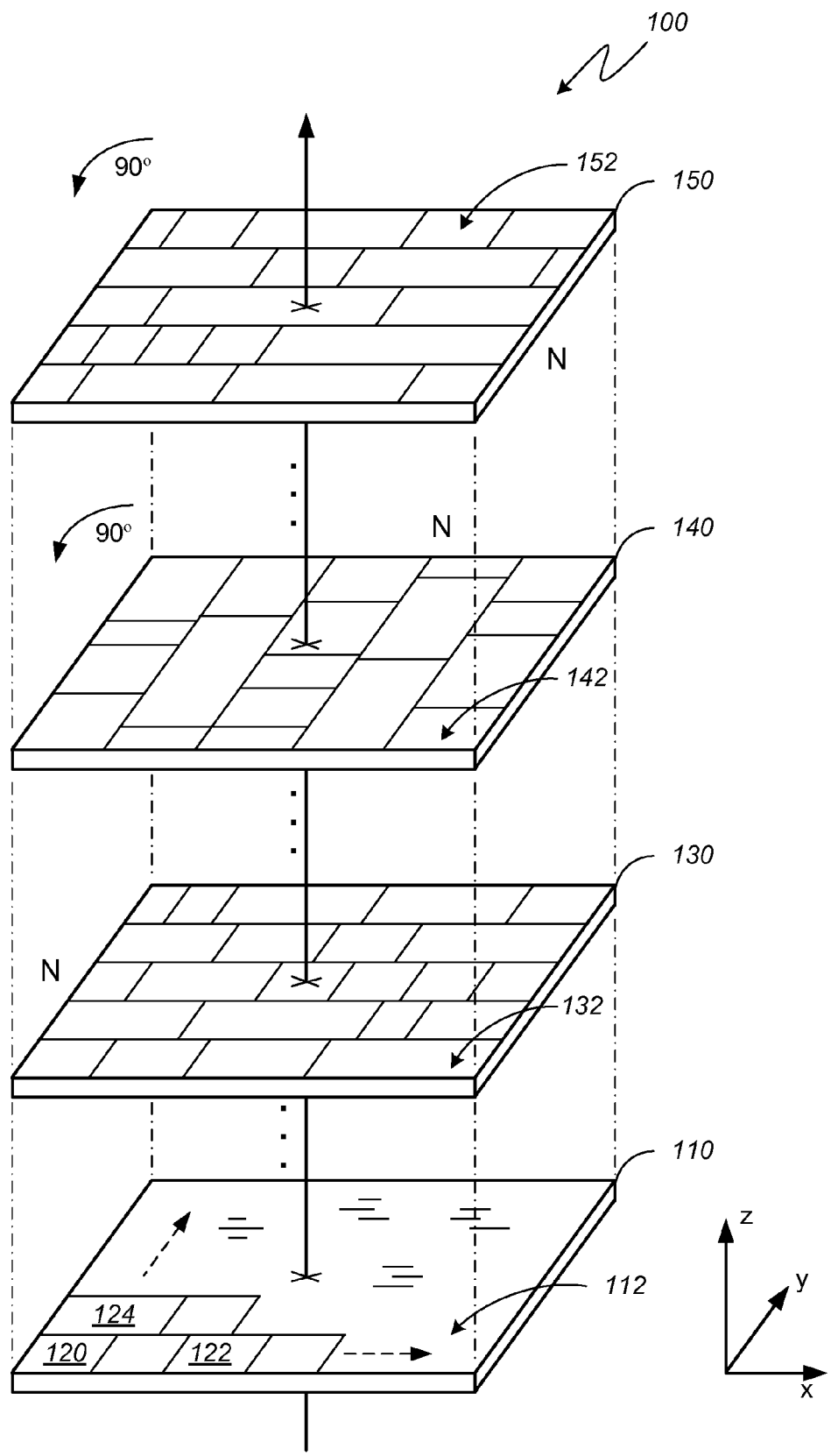

FIG. 1B is an exploded view of multiple-layer ASIC 100. Cell 120, cell 122, and cell 124 among others are arranged along upper surface 112 of substrate 110. As described above, each of cell 120, cell 122, and cell 124 are a collection of elements 115 (FIG. 1A) arranged to perform a desired function. First insulating layer 130 separates the various circuit elements on upper surface 112 from first metallization layer 132. First metallization layer 132 includes a number of regions arranged such that each shares a desired length along a first direction substantially in line with the axis labeled "y." As illustrated in FIG. 1B, the axis labeled "y" is substantially orthogonal to both the axis labeled "x" and the axis labeled "z." Conductors routed on first metallization layer 132 are substantially parallel to the axis labeled "x." Conductors on first metallization layer 132 can be coupled to circuits in IC 100 such that they conduct current in the positive x direction only, the negative x direction only, or both depending on the application.

Second insulating layer 140 separates first metallization layer 132 from second metallization layer 142. Second metallization layer 142 includes a number of regions arranged such that each shares a desired length along a first direction that is rotated approximately 90° from the regions along first metallization layer 132. Conductors routed on second metallization layer 142 are substantially parallel to the axis labeled "y." Conductors on second metallization layer 142 can be coupled to circuits in IC 100 such that they conduct current in the positive y direction only, the negative y direction only, or both depending on the application.

Third insulating layer 150 separates second metallization layer 142 from third metallization layer 152. Third metallization layer 152 includes a number of regions arranged such that each shares a desired length along a first direction that is rotated approximately 90° from the regions along second metallization layer 142. Conductors routed on third metallization layer 152 are substantially parallel to the axis labeled "x." Conductors on third metallization layer 152 can be coupled to circuits in IC 100 such that they conduct current in the positive x direction only, the negative x direction only, or both depending on the application.

Although the illustrated embodiments of multiple-layer ASIC 100 are shown having similarly sized regions along the constrained dimension (i.e., the edges labeled "N") along the respective metallization layers, it is important to note that respective regions of each of the metallization layers are defined on a region by region basis. That is the arbitrary length as well as the length from boundary to boundary may be different from region to region across the mask data.

Figure 2:
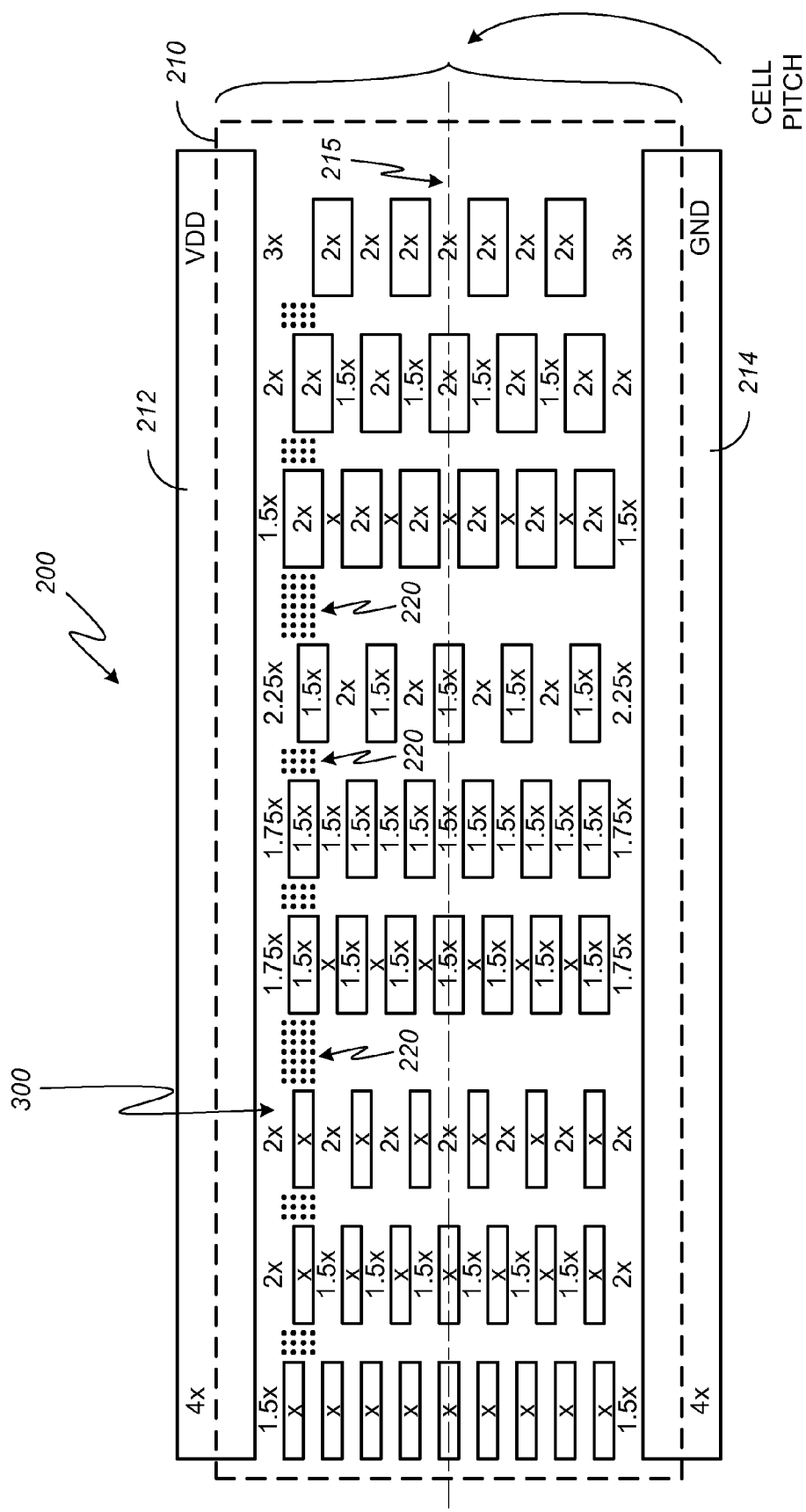
FIG. 2 is schematic diagram illustrating an embodiment of a cell from the application-specific integrated circuit of FIG. 1.

FIG. 2 is schematic diagram illustrating an embodiment of a cell from the application-specific integrated circuit 100 of FIG. 1. Cell 200 is defined by a boundary 210. In one dimension, boundary 210 and cell pitch are defined by the distance between respective centerlines of adjacent conductors dedicated to supply power and electrical ground to the various circuit components within cell 200. In the illustrated embodiment, conductor 212 is coupled to a power supply and conductor 214 is coupled to electrical ground. A set of routing definitions 300 is depicted schematically by showing the relative distances of adjacent conductive tracks as defined by mask data. Each of the members of the set of routing definitions is symmetrical about centerline 215 of cell 200. Thus, centerline 215 bisects cell 200. The example set of routing definitions 300 includes nine members with each member defined by vertically arranged horizontal tracks separated vertically by a minimum unit separation distance between adjacent conductors. In addition, each member of the set includes a common unit conductor width labeled "X." In the example embodiment, the minimum unit separation distance is substantially the same as the unit conductor width across the set of routing definitions 300. Border conductors, i.e., conductor 212 and conductor 214 share substantially the same width, with the border conductor width being approximately an integer multiple of the minimum unit separation distance and the unit conductor width. In the illustrated embodiment, the integer multiple is four (4). Conductor 212 and conductor 214 are shared with adjacent circuit shells (not shown) in a mirrored fashion. That is, every other border conductor will be coupled to either a suitable power supply or electrical ground.

A first member of the set of routing definitions 300 is depicted in the leftmost column of vertically arranged conductor tracks. The first member is defined by nine (9) substantially parallel conductor tracks. Each conductor track has the unit conductor width X. Adjacent conductor tracks are separated from each other by the minimum unit separation distance. The uppermost and lowermost tracks are separated from border conductor 212 and border conductor 214, respectively, by a distance that is substantially equal to one and a half (1½) times the unit conductor width.

A second member of the set of routing definitions 300 is depicted by the column of vertically arranged conductor tracks that is second from the left. The second member is defined by seven (7) substantially parallel conductor tracks. Each conductor track has the unit conductor width X. Adjacent conductor tracks are separated from each other by approximately one and a half (1½) times the unit conductor width or one and a half (1½) times the minimum unit separation distance. The uppermost and lowermost tracks are separated from border conductor 212 and border conductor 24, respectively, by a distance that is substantially equal to 2 times the unit conductor width.

A third member of the set of routing definitions 300 is depicted by the column of vertically arranged conductor tracks that is third from the left. The third member is defined by six (6) substantially parallel conductor tracks. Each conductor track has the unit conductor width X. Adjacent conductor tracks are separated from each other by approximately two (2) times the unit conductor width or two (2) times the minimum unit separation distance. The uppermost and lowermost tracks are separated from border conductor 212 and border conductor 24, respectively, by a distance that is substantially equal to 2 times the unit conductor width.

A fourth member of the set of routing definitions 300 is depicted by the column of vertically arranged conductor tracks that is fourth from the left. This fourth member is defined by seven (7) substantially parallel conductor tracks. Each conductor track is approximately one and a half (1½) times as wide as the unit conductor width X. Adjacent conductor tracks are separated from each other by a distance that approximates the unit conductor width or the minimum unit separation distance. The uppermost and lowermost tracks are separated from border conductor 212 and border conductor 24, respectively, by a distance that is substantially equal to one and three-quarters (1¾) times the unit conductor width.

A fifth member of the set of routing definitions 300 is depicted by the column of vertically arranged conductor tracks that is fifth from the left. This fifth member is defined by six (6) substantially parallel conductor tracks. Each conductor track is approximately one and a half (1½) times as wide as the unit conductor width X. Adjacent conductor tracks are separated from each other by approximately one and half (1½) times the unit conductor width or the minimum unit separation distance. The uppermost and lowermost tracks are separated from border conductor 212 and border conductor 24, respectively, by a distance that is substantially equal to one and three-quarters (1¾) times the unit conductor width.

A sixth member of the set of routing definitions 300 is depicted by the column of vertically arranged conductor tracks that is sixth from the left. This sixth member is defined by five (5) substantially parallel conductor tracks. Each conductor track is approximately one and a half (1½) times as wide as the unit conductor width X. Adjacent conductor tracks are separated from each other by approximately two (2) times the unit conductor width or the minimum unit separation distance. The uppermost and lowermost tracks are separated from border conductor 212 and border conductor 24, respectively, by a distance that is substantially equal to two and one-quarter (2¼) times the unit conductor width.

A seventh member of the set of routing definitions 300 is depicted by the column of vertically arranged conductor tracks that is seventh from the left. This seventh member is defined by six (6) substantially parallel conductor tracks. Each conductor track is approximately two (2) times as wide as the unit conductor width X. Adjacent conductor tracks are separated from each other by approximately the unit conductor width or the minimum unit separation distance. The uppermost and lowermost tracks are separated from border conductor 212 and border conductor 24, respectively, by a distance that is substantially equal to one and half (1½) times the unit conductor width.

An eighth member of the set of routing definitions 300 is depicted by the column of vertically arranged conductor tracks that is eighth from the left. This eighth member is defined by five (5) substantially parallel conductor tracks. Each conductor track is approximately two (2) times as wide as the unit conductor width X. Adjacent conductor tracks are separated from each other by approximately one and a half (1½) times the unit conductor width or the minimum unit separation distance. The uppermost and lowermost tracks are separated from border conductor 212 and border conductor 24, respectively, by a distance that is substantially equal to two (2) times the unit conductor width.

A ninth member of the set of routing definitions 300 is depicted by the column of vertically arranged conductor tracks that is the furthest to the right. This ninth member is defined by four (4) substantially parallel conductor tracks. Each conductor track is approximately two (2) times as wide as the unit conductor width X. Adjacent conductor tracks are separated from each other by approximately two (2) times the unit conductor width or the minimum unit separation distance. The uppermost and lowermost tracks are separated from border conductor 212 and border conductor 24, respectively, by a distance that is substantially equal to three (3) times the unit conductor width.

Interspersed throughout cell 200 is an array of points 220. Each member of the array of points 220 identifies a location along a planar surface or layer within the modeled multiple-layer ASIC 100. In the illustrated embodiment, each point in the array of points 220 is separated from its nearest neighbors horizontally and vertically by a like distance. The array of points 220 is not limited to this arrangement. For example, in alternative embodiments, a first separation distance along a first axis is different from a second separation distance along a second axis orthogonal to the first axis. Regardless, of the first separation distance and second separation distance members of the array of points 220 are arranged to align with corresponding members on each of the layers of the multiple-layer ASIC 100. In this way, tracks and vias can be controllably located along each cell in the model.

The embodiment illustrated in FIG. 2 is one in which the minimum conductor width and the minimum unit separation distance are substantially equal. It should be understood that alternative embodiments exist where the minimum conductor width and the minimum unit separation distance are dissimilar in length.

The embodiment illustrated in FIG. 2 includes a set of routing definitions wherein the power and ground conductors are arranged along opposing borders of cell 200. It should be understood that alternative sets of routing definitions exist wherein the power and ground conductors are arranged within the cell 200.

FIG. 3 is a schematic diagram illustrating an alternative representation of the set of routing definitions 300 introduced in FIG. 2. Each member of the set of routing definitions 300 is again arranged in a columnar format. A first row, labeled "Border Conductor Width," shows that each member shares a border conductor width that is approximately four times the unit conductor width. A second row from the top labeled "First Separation," shows the relative distances between adjacent conductors within a cell that is designed by the routing definition. The middle row of the diagram, labeled "Conductor Width" illustrates the widths of the cell tracks as a function of the unit cell width. The next to last row, labeled "Second Separation," illustrates the relative distances between the uppermost and lowermost tracks of the cell and the upper and lower border conductors, respectively. The last row illustrates the number of conductors in the cell.

Figure 4:
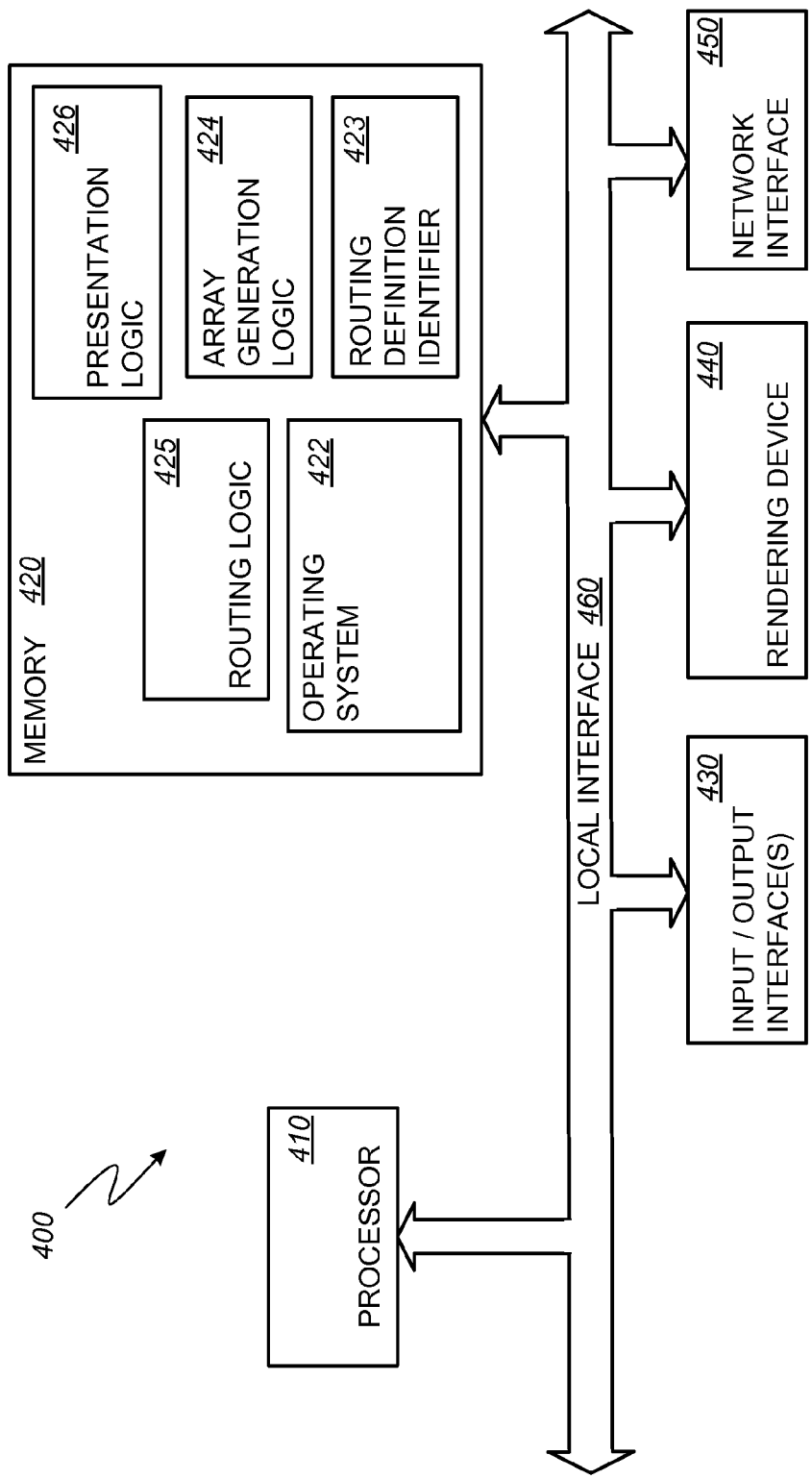
FIG. 4 is a functional block diagram illustrating an embodiment of a design tool.

FIG. 4 is a functional block diagram illustrating an embodiment of a design tool 400. Generally, in terms of hardware architecture, as shown in FIG. 4, design tool 400 is a general purpose computing device or other hardware device that includes processor 410, memory 420, input/output (I/O) interface(s) 430 and network interface 450. Processor 310, memory 420, I/O interface(s) 430, rendering device 440 and network interface 450 are communicatively coupled via local interface 460. The local interface 460 can be, for example but not limited to, one or more buses or other wired or wireless connections, as is known in the art. The local interface 460 may have additional elements, which are omitted for simplicity, such as controllers, buffers (caches), drivers, repeaters, and receivers, to enable communications. Further, the local interface 460 may include address, control, power and/or data connections to enable appropriate communications among the aforementioned components. Moreover, local interface 460 provides power to each of the processor 410, memory 420, I/O interface(s) 430, rendering device 440 and network interface 450 in a manner understood by one of ordinary skill in the art.

Processor 410 is a hardware device for executing software (i.e., programs or sets of executable instructions), particularly that stored in memory 420. The processor 410 can be any custom made or commercially available processor, a central processing unit (CPU), an auxiliary processor among several processors associated with design tool 400, a semiconductor based microprocessor (in the form of a microchip or chip set), or generally any device for executing instructions.

Memory 420 can include any one or combination of volatile memory elements (e.g., random-access memory (RAM), such as dynamic random-access memory (DRAM), static random-access memory (SRAM), synchronous dynamic random-access memory (SDRAM), etc.) and nonvolatile memory elements (e.g., read-only memory (ROM), hard drive, tape, compact disk read-only memory (CD-ROM), etc.). Moreover, the memory 420 may incorporate electronic, magnetic, optical, and/or other types of storage media. Note that the memory 420 can have a distributed architecture, where various components are situated remote from one another, but can be accessed by the processor 410.

The software in memory 420 may include one or more separate programs, each of which comprises an ordered listing of executable instructions for implementing logical functions. In the example embodiment illustrated in FIG. 4, the software in the memory 420 includes operating system 422, routing definition identifier 423, array generation logic 424, routing logic 425 and presentation logic 426. The operating system 422 essentially controls the execution of other computer programs and provides scheduling, input-output control, file and data management, memory management, communication control and related services.

Routing definition identifier 423 is a symbol or data word comprising sufficient resolution or an adequate number of logic bits to identify separately each member of the set of routing definitions 300.

Array generation logic 424 includes one or more programs and one or more data elements that enable design tool 400 to map a set of points or locations across the surfaces of the substrates used to form multiple-layer ASIC 100. Array generation logic 424 may include one or buffers and parameter stores for holding configuration information and or data as may be required to interface with any number of display devices that may be coupled to design tool 400. Array generation logic 424 further includes logic that is responsive to one or more inputs that are applied via input/output interfaces 430 to direct the representation of a subset of all points identifying locations across a specified and localized area of the design. For example, an operator input may be applied to direct design tool 400 to present every nth location along a first vector. That is, the input directs the design tool to display a "dot" or some other symbol or icon in a staggered fashion across a display screen to guide designers who use the design tool to route conductors between select locations in the design. The same operator input may be used to direct design tool 400 to present every fifth location along a second vector orthogonal to the first vector or can be used to present some other interval of the set of all locations.

Routing logic 425 includes one or more programs and one or more data elements that enable design tool 400 to generate and store data associated with the design of multiple-layer ASIC 100. Routing logic 425 may include one or buffers and parameter stores for holding configuration information and or data as may be required to identify or otherwise model various semiconductor devices, resistive devices, capacitive devices, etc. associated with the design. Routing logic 425 interacts with the array of identified locations created by array generation logic to model the various connecting conductors across the circuit design.

Presentation logic 426 includes one or more programs and one or more data elements that enable design tool 400 to communicate data associated with the design of multiple-layer ASIC 100. Presentation logic 426 may include one or buffers and parameter stores for holding configuration information and or data as may be required to interface with any number of printers and display devices that may be coupled to design tool 400.

Array generation logic 424, routing logic 425 and presentation logic 426 are source programs, executable programs (object code), scripts, or other entities that include a set of instructions to be performed. When implemented as source programs, the programs are translated via a compiler, assembler, interpreter, or the like, which may or may not be included within memory 420, to operate properly in connection with O/S 422.

I/O interface(s) 430 includes multiple mechanisms configured to transmit and receive information via design tool 400. These mechanisms support human-to-machine (e.g., a keyboard) and machine-to-human information transfers. Such human-to-machine interfaces may include touch sensitive displays or the combination of a graphical-user interface and a controllable pointing device such as a mouse. Moreover, these mechanisms can include voice-activated interfaces that use a microphone or other transducer.

Rendering device 440 enables design tool 400 to communicate information with various network coupled display devices such as printers, plotters, monitors, etc. Rendering device 440 is a hardware device that is responsible for producing graphical abstractions in accordance with one or more programs and data. Rendering device 440 receives instructions and data from processor 410 and memory 420 and generates one or more output signals suitable for directing the presentation of information via a designated output device.

Network interface 450 enables design tool 400 to communicate with various network-coupled devices, including other devices that may be adding or otherwise editing mask data associated with the design of multiple-layer ASIC 100 (FIG. 1). Network interface 450 performs a variety of functions including, for example the signal conditioning and format conversions to communicate data. Preferably, network interface 450 is compatible with one or both of the Gigabit Ethernet standards (i.e., IEEE 802.3z Fiber Optic Gigabit Ethernet and IEEE 802.3ab Twisted-Pair Gigabit Ethernet) and the TCP/IP protocol. It should be understood that other data-network interfaces compatible with other network protocols including wireless protocols may also be used.

When design tool 400 is in operation, the processor 410 is configured to execute software stored within the memory 420, to communicate data to and from the memory 420, and to control operations of the design tool 400 pursuant to the software. The routing definition identifier 423, array generation logic 424, routing logic 425, presentation logic 426, and the O/S 422, in whole or in part, but typically the latter, are read by the processor 410, perhaps buffered within the processor 410, and then executed.

When routing definition identifier 423, array generation logic 424, routing logic 425, presentation logic 426 are implemented in a memory, as is shown in FIG. 4, it should be noted that these programs and data elements can be stored on any computer-readable medium for use by or in connection with any computer related system or method. In the context of this document, a "computer-readable medium" can be any means that can store, communicate, propagate, or transport program(s) for use by or in connection with an integrated circuit design tool. The computer-readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a RAM (electronic), a ROM (electronic), an erasable programmable read-only memory (EPROM), an electrically erasable programmable read-only memory (EEPROM), or Flash memory) (electronic), an optical fiber (optical), and a CDROM (optical). Note that the computer-readable medium could even be paper or another suitable medium upon which the program is printed, as the program can be electronically captured, via optical scanning of the paper or other medium, then compiled, interpreted or otherwise processed in a suitable manner if necessary, and then stored in a computer memory.

In an alternative embodiment, where one or more of the routing definition identifier 423, array generation logic 424, routing logic 425 and presentation logic 426 are implemented in hardware, the routing definition identifier 423, array generation logic 424, routing logic 425, presentation logic 426 can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field-programmable gate array (FPGA), flip-flops, etc.

Figure 5:
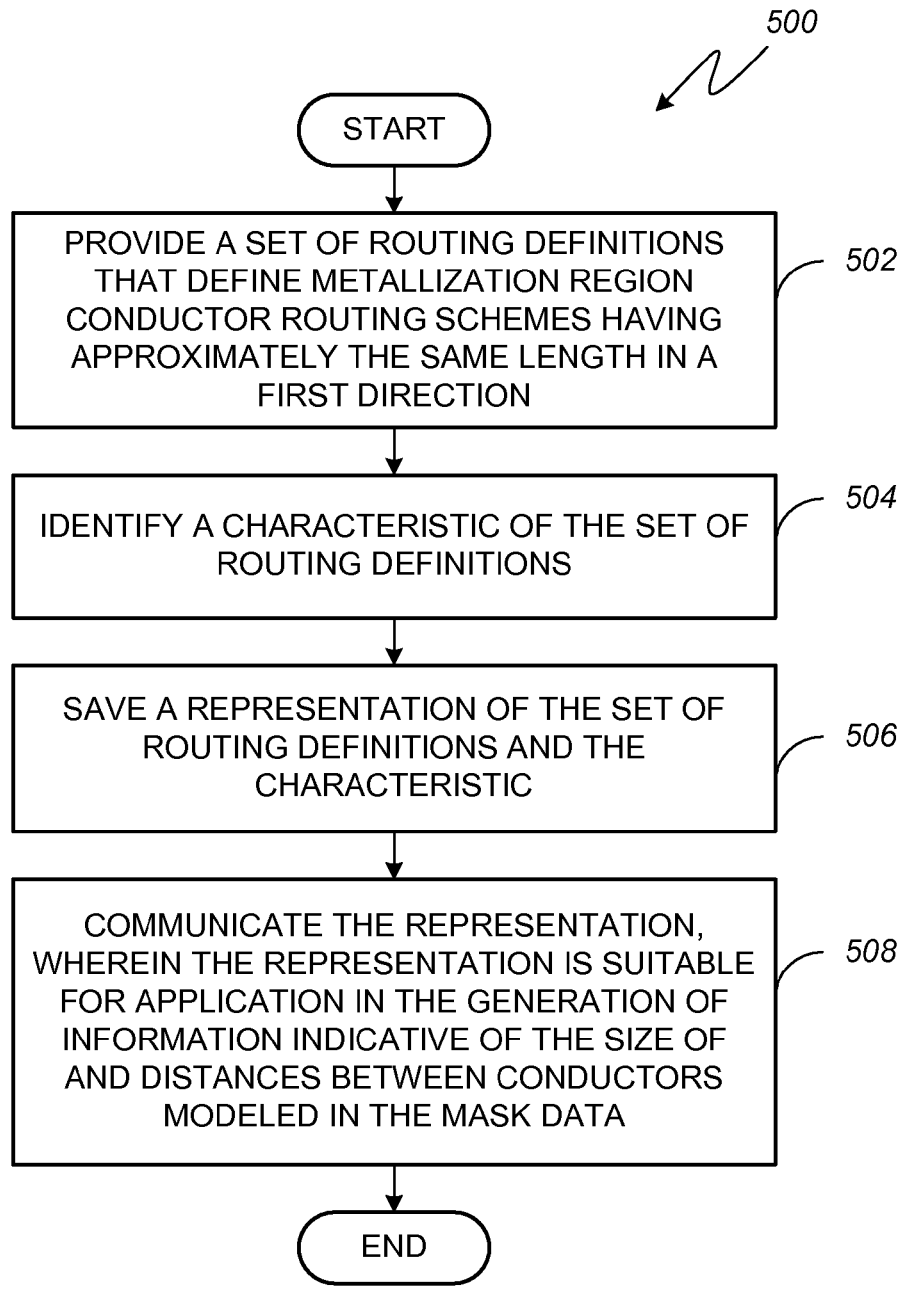
FIG. 5 is a flow diagram illustrating an embodiment of a method for directing the generation of information defining conductor route constraints in a mask data representation of an integrated circuit.

FIG. 5 is a flow diagram illustrating an embodiment of a method 500 for directing the generation of information defining conductor route constraints in mask data. Method 500 begins with block 502 where a set of routing definitions are provided. The routing definitions include a set of relationships and rules that define metallization region conductor routing schemes having approximately the same length in a first direction. The relationships and rules constrain the size and placement of conductors in the first direction. Thereafter, as indicated in block 504, a characteristic of the set of routing definitions is identified. A set of locations associated with respective members of the array of equally spaced points is a function of a characteristic of the set of routing definitions. Thereafter, as indicated in block 506 a representation of the set of routing definitions and the characteristic is generated. The representation can be in the form of a file having a defined format, a database table, a data string, etc. For example, in some embodiments, the set of routing definitions is arranged and stored in a definition file that uses a library exchange format. Next, as indicated in block 508, the representation is communicated to a design tool or an operator who is tasked with interconnecting various integrated circuit design cells by placing appropriately sized conductors in a select sub-region of a metallization layer. When the representation is communicated to a design tool, the representation can be used to constrain or otherwise direct one or more automatic routers to complete or layout the mask data that will be used to produce the desired integrated circuit.

It should be understood that the steps illustrated in FIG. 5 and described above could be performed in other sequences distinct from the sequence shown in FIG. 5. For example, the characteristic of the set of routing definitions could be identified at any time after the set of routing definitions is defined.

Figure 6:
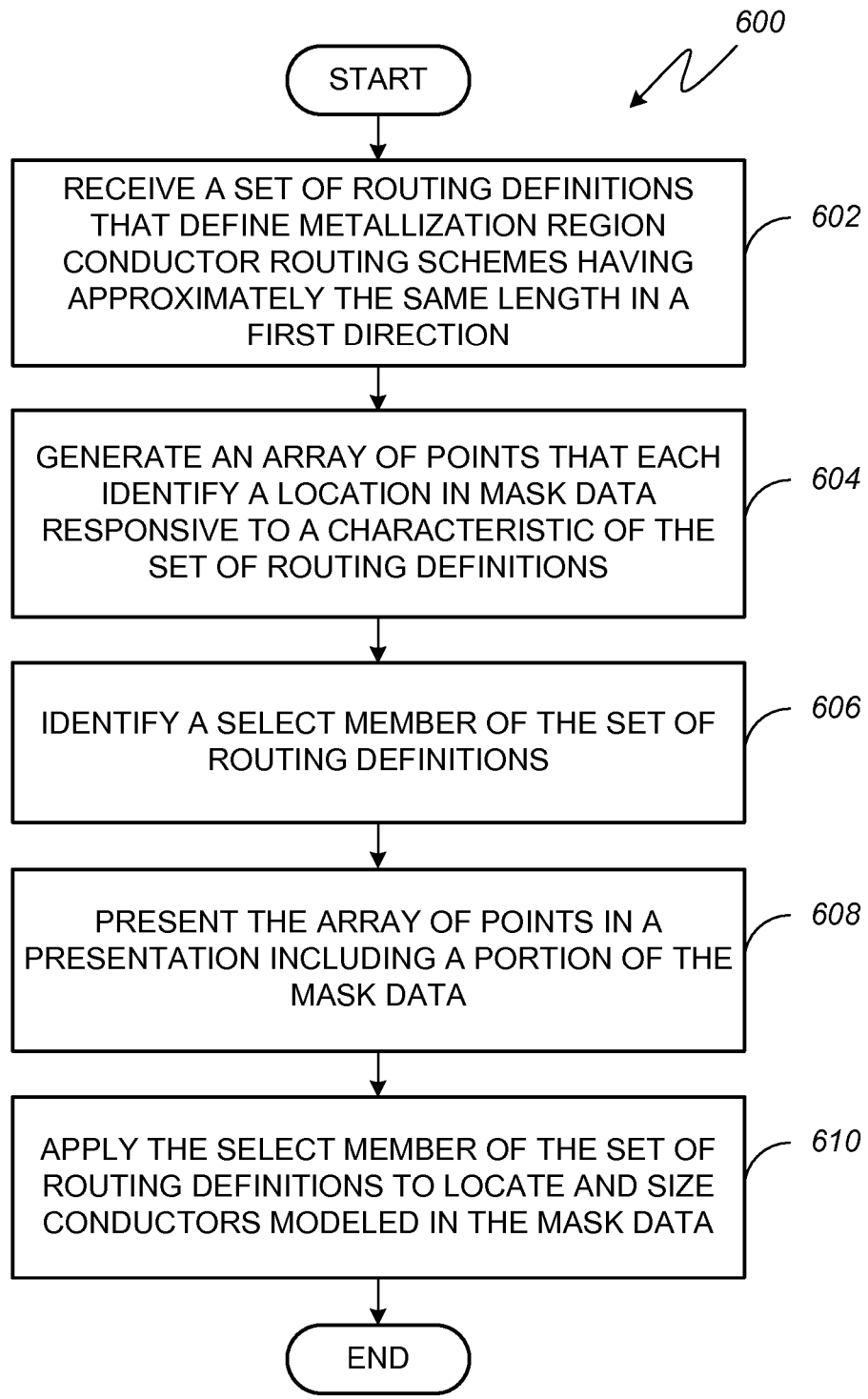
FIG. 6 is a flow diagram illustrating an embodiment of a method for generating mask data.

FIG. 6 is a flow diagram illustrating an embodiment of a method for generating mask data. Method 600 begins with block 602 where a set of routing definitions are received. The routing definitions include a set of relationships and rules that define metallization region conductor routing schemes having approximately the same length in a first direction. The relationships and rules constrain the size and placement of conductors in the first direction. As described above, the routing definitions can be arranged or otherwise stored in a predetermined file format, as a database table, or other data abstraction. Thereafter, as indicated in block 604, an array of points that identifies locations in mask data is generated. The relative position of each of the individual points in the array with its nearest neighbors is responsive to a characteristic of the set of routing definitions. As indicated in block 606, a select member of the set of routing definitions is identified. Next, the array of points is presented in a presentation of a portion of the mask data, as indicated in block 608. Thereafter, as shown in block 610, the select member of the set of routing definitions identified in block 606 is applied when locating and sizing conductors modeled in the mask data.

It should be understood that the steps illustrated in FIG. 6 and described above could be performed in other sequences distinct from the sequence shown in FIG. 6. For example, a select member of the set of routing definitions could be identified any time after the set is defined and before the application thereof to locate and size conductors in the mask data representation of an IC.

The foregoing description has been presented for purposes of illustration and description. It is not intended to be exhaustive or to limit the scope of the claims to the precise forms disclosed. Modifications or variations are possible in light of the above teachings. The embodiments discussed, however, were chosen and described to enable one of ordinary skill to utilize various embodiments of the present design tool and method for generating mask data. All such modifications and variations are within the scope of the appended claims when interpreted in accordance with the breadth to which they are fairly and legally entitled.

What is claimed is:

1. A method for directing the generation of information defining conductor route constraints in mask data, comprising:
    providing a set of routing definitions that define sub-region conductor routing schemes having approximately the same length in a first direction;
    identifying a characteristic of the set of routing definitions;
    saving a representation of the set of routing definitions and the characteristic; and
    communicating the representation, wherein the representation is suitable for application in the generation of information in the mask data, the information defining the size of and distances between a set of conductors modeled in the mask data.

2. The method of claim 1, wherein each member of the set of routing definitions is symmetric about an axis that bisects a sub-region.

3. The method of claim 1, wherein each member of the set of routing definitions comprises a unit conductor width.

4. The method of claim 1, wherein each member of the set of routing definitions comprises at least a unit separation distance between adjacent conductors.

5. The method of claim 1, wherein each member of the set of routing definitions comprises at least a unit conductor width that is equal to a minimum unit separation distance between adjacent conductors.

6. The method of claim 5, wherein the mask data comprises an array of equally spaced points that are separated from nearest neighbor points in the array by approximately one-half the unit conductor width.

7. The method of claim 1, wherein the set of routing definitions share a common border conductor width.

8. The method of claim 7, wherein the common border conductor width is an integer multiple of the unit conductor width.

9. The method of claim 1, wherein the set of routing definitions includes members having uniform conductor widths that are a function of a first factor of a unit conductor width.

10. The method of claim 9, wherein the first factor is selected from the group consisting of 1.0, 1.5, and 2.0.

11. The method of claim 9, wherein the set of routing definitions includes members having a first separation distance and a second separation distance.

12. The method of claim 11, wherein the first separation distance comprises the product of the unit conductor width and the first factor.

13. The method of claim 11, wherein the second separation distance comprises the product of the unit conductor width and a second factor selected from the group consisting of 1.5, 1.75, 2.0, 2.25, and 3.0.

14. A design tool for generating mask data for an integrated circuit, comprising:
    a memory configured to store a set of routing definitions that define sub-region conductor routing schemes having approximately the same length in a first direction;
    a processor configured to receive an input identifying a select routing definition from the set of routing definitions, the processor configured to execute logic that generates an array of equally spaced points responsive to a characteristic of the set of routing definitions and execute logic configured to constrain the relative location and the width of conductors in accordance with the select routing definition.

15. The design tool of claim 14, wherein the array of equally spaced points are separated by approximately one-half a unit conductor width.

16. The design tool of claim 14, wherein the set of routing definitions share a common border conductor width.

17. The design tool of claim 14, wherein the set of routing definitions includes members having uniform conductor widths that are a product of a first factor and a unit conductor width.

18. The design tool of claim 17, wherein the first factor is selected from the group consisting of 1.0, 1.5, and 2.0.

19. The design tool of claim 17, wherein the set of routing definitions includes members having a first separation distance and a second separation distance.

20. The design tool of claim 19, wherein the first separation distance is a product of the unit conductor width and the first factor.

21. The design tool of claim 19, wherein the second separation distance comprises a product of the unit conductor width and a second factor selected from the group consisting of 1.5, 1.75, 2.0, 2.25, and 3.0.

22. A method for generating mask data for an integrated circuit design, comprising:

receiving a set of routing definitions that define sub-region conductor routing schemes having approximately the same length in a first direction;

generating an array of points that each identify a location in mask data responsive to a characteristic of the set of routing definitions;

identifying a select member of the set of routing definitions;

presenting the array of points in a presentation including a portion of the mask data; and applying the select member of the set of routing definitions to an integrated circuit design tool that generates the mask data, the select member being applied to locate and size a set of conductors modeled in the mask data.

23. The method of claim 22, wherein the set of routing definitions defines conductor routing schemes that are not constrained in a second direction substantially orthogonal to the first direction.

24. The method of claim 23, wherein applying the select member of the set of routing definitions constrains the space between adjacent conductors modeled in the mask data.

25. The method of claim 22, wherein presenting the array of points comprises presenting every $n^{th}$ point in response to an input.

* * * * *